United States Patent [19]

Cheng et al.

[11] Patent Number: 5,500,545
[45] Date of Patent: Mar. 19, 1996

[54] DOUBLE SWITCHING FIELD EFFECT TRANSISTOR AND METHOD OF MANUFACTURING IT

[75] Inventors: Kuang-Chung Cheng, Hsinchu; Meng-Jin Tsai, Kaohsiung; Ta-Chi Kuo; Kuo-Jaan Su, Hsinchu, all of Taiwan

[73] Assignee: United Microelectronics Corporation, Hsinchu, Taiwan

[21] Appl. No.: 394,585

[22] Filed: Feb. 27, 1995

[51] Int. Cl.⁶ ............................. H01L 21/36; H01L 21/26
[52] U.S. Cl. ......................... 257/341; 257/350; 257/401; 437/46; 437/937; 437/941
[58] Field of Search ...................... 257/341, 347, 257/349, 350, 401, 365, 366, 368; 437/40, 46, 56, 937, 941

[56] References Cited

U.S. PATENT DOCUMENTS

| | | | |
|---|---|---|---|
| 4,609,407 | 9/1986 | Masao et al. | 257/401 |
| 4,651,408 | 3/1987 | MacElwee et al. | 257/350 |
| 4,686,758 | 8/1987 | Liu et al. | 257/401 |
| 5,315,143 | 5/1994 | Tsuji | 257/401 |

OTHER PUBLICATIONS

VLSI Technology (second edition) by S. M. Sze, pub. by McGraw–Hill in 1988, p. 127.

Primary Examiner—Donald L. Monin, Jr.
Attorney, Agent, or Firm—George O. Saile

[57] ABSTRACT

A field effect transistor has been developed with one source and one drain but with two independent active regions. It is shown how a double switching characteristic can be obtained with this structure which is described along with a process for its manufacture.

17 Claims, 3 Drawing Sheets

5,500,545

DOUBLE SWITCHING FIELD EFFECT TRANSISTOR AND METHOD OF MANUFACTURING IT

BACKGROUND OF THE INVENTION

(1) FIELD OF THE INVENTION

The invention is in the general field of semiconductor circuits, more particularly field effect transistors.

(2) DESCRIPTION OF THE PRIOR ART

It is believed that the device structure that constitutes the present invention, as well as the specific process for making it, have not been anticipated in the prior art.

The use of a hydrogen anneal for neutralizing charge trapped at the oxide-semiconductor interface has been described in, for example, VLSI TECHNOLOGY (second ed.) by S. M. Sze published by McGraw-Hill in 1988, page 127.

SUMMARY OF THE INVENTION

It has been an object of this invention to develop a field effect transistor with a wider range of performance characteristics than is available in the state of the art. This has been achieved through the addition to the device of a second active region.

A further object of the invention has been to develop a process for the manufacture of the device. The resulting process is described in detail.

DESCRIPTION OF THE PREFERRED EMBODIMENTS

The basic elements of a Field Effect Transistor (FET) include two regions within a semiconductor body that have the same conductivity type separated by a region of opposite conductivity type. The two regions of the same type are referred to as a source and a drain, the region between them being called the active region. The electrical resistance between the source and drain is very high since they both form P-N junctions relative to the active region and one of these junctions will always be back biassed. If, now, the active region is covered with a layer of insulation followed by a metal layer to which electrical contact can be made (referred to as the gate electrode), it becomes possible to create an electric field across the layer of insulation such that electrons will be either attracted to or repelled from the surface of the active region.

Thus, by applying a suitable voltage to the gate, the conductivity type at the surface of the active region can be changed at will, thereby controlling the conductance between the source and drain regions. So, relatively small changes in gate voltage can cause large changes in the current flowing between the source and the drain.

The performance characteristics of a given FET device depend on a number of factors such as its geometry and the conductivity and conductivity type of the three main regions. Within those constraints a variety of performance characteristics can be generated. It has been an object of the present invention to provide the FET designer with an additional degree of freedom in the generation of such characteristics. This has been achieved by adding to the device a second active region with its own, separately controllable, gate electrode.

Figure 1:
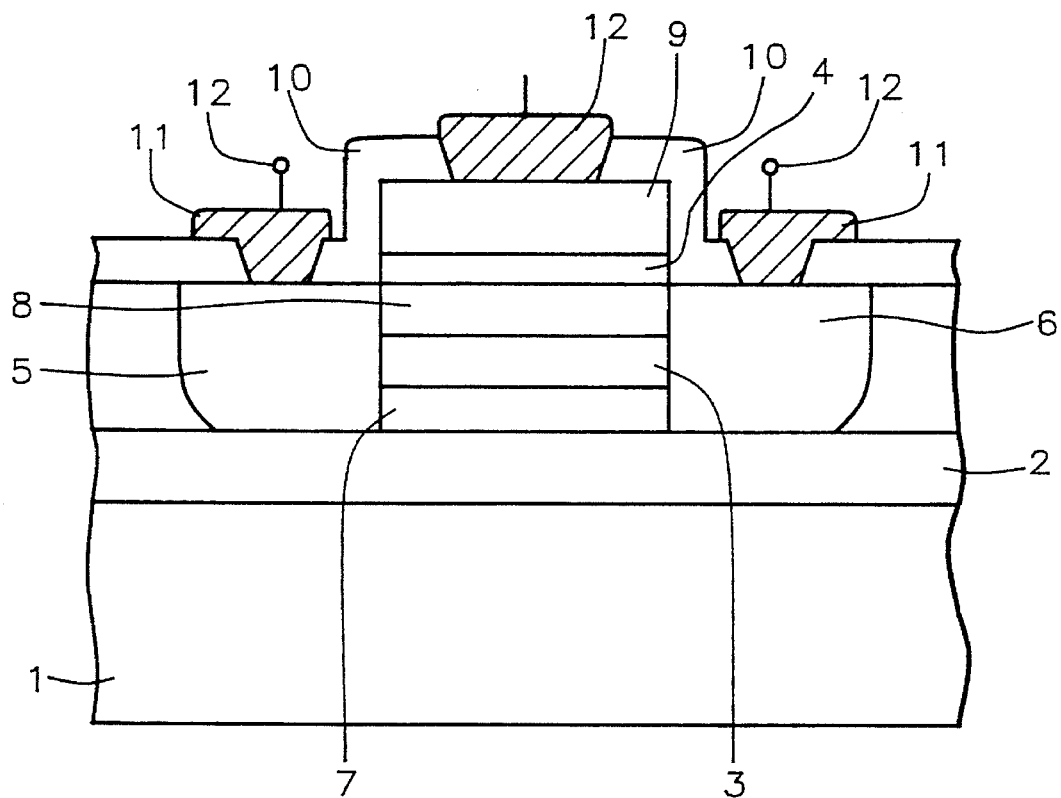
FIG. 1 is a schematic cross-section of the device.

Referring now to FIG. 1, we show, in schematic cross-section, a view of the device. While only a single device is shown here, it will be understood by those familiar with integrated circuits that many devices are manufactured, and may subsequently co-exist, on the same body of semiconducting material (for example silicon). In this instance we show a portion of a body of P type silicon 1. Source and drain regions, 5 and 6 of conductivity type N+, are embedded within the silicon body and a layer of silicon oxide 2 between 500 and 10,000 Angstrom Units thick underlies them both.

The source and drain regions, 5 and 6, are connected to one another through the two active regions 7 and 8, each of which has a thickness of between 50 and 3,000 Angstrom Units and which are composed of P type silicon. Separating these two regions is a layer of silicon oxide 3 whose thickness is between 20 and 1,000 Angstrom Units. A layer of N+ silicon 9 serves as the gate electrode for controlling the conductance of active region 8. In order to prevent surface leakage between gate electrode 9 and the source and drain regions, 5 and 6, a layer of passivating insulation 10 has been deposited over the entire top surface. Via holes such the one labelled 11 have been etched through the surface of 10 so as to allow electrical contact to be made to the source, drain, and gate regions by means of at least one deposited metal layer, an example of which is shown as 12 in FIG. 1.

Figure 2:
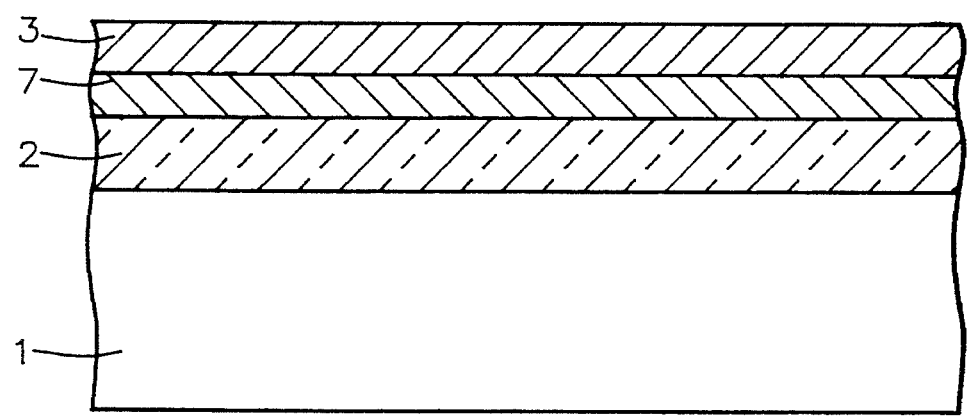
FIGS. 2 and 3 are schematic cross-sections at two stages during the manufacture of the device.

The process for manufacturing the double switching FET that constitutes this invention is as follows: As illustrated in FIG. 2, a body of P type silicon 1, typically a silicon wafer, is heated in an oxidizing atmosphere so that a layer of silicon oxide 2, between 500 and 10,000 Angstrom Units thick is produced on the surface. A layer of polycrystalline silicon 7 is then deposited by means of chemical vapor deposition (CVD) onto the surface of oxide layer 2, a second layer of silicon oxide 3 is laid down through thermal oxidation or by the deposition of additional silicon oxide by means of CVD for a total thickness of between 20 and 1,000 Angstrom Units.

Figure 3:
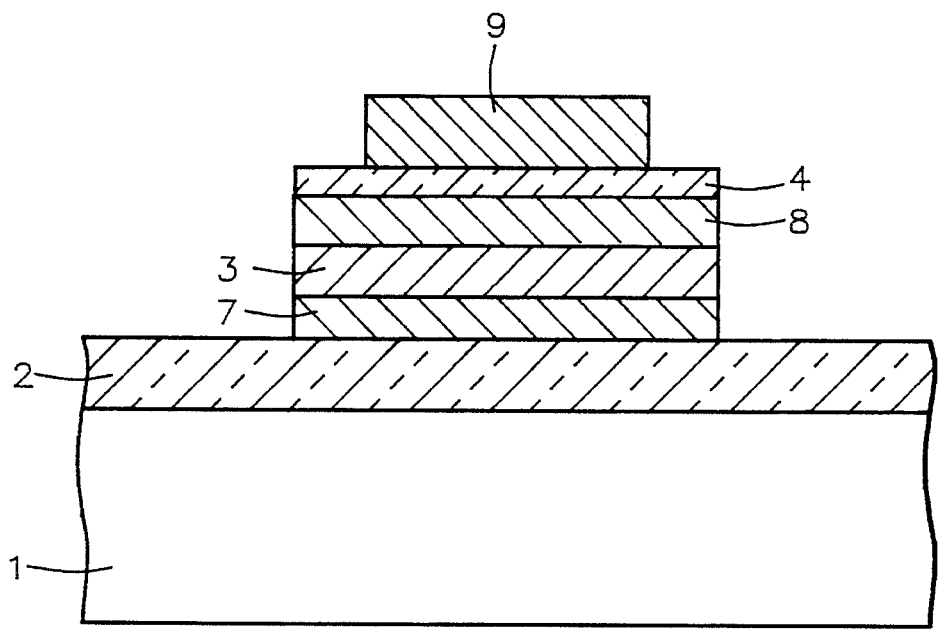

Then a layer of alpha silicon (polycrystalline silicon) 8 is deposited on layer 3 by CVD. A photoresist mask is then used to define the device region. Dielectric layer 4, between 20 and 1,000 Angstrom units thick, is then thermally grown or CVD deposited on layer 8. The structure at this stage has the appearance seen in FIG. 2. Polycrystalline layer 9 is then deposited and defined as the gate electrode, as shown in FIG. 3. A self-aligned ion implantation process is then employed to form gate 9, drain 6, and source 5. N type dopants such as phosphorus or arsenic were chosen as the implantation ions. The energy of the ions was in the range 20–200 keV, which is appropriate for their penetration down to the depth of layer 2. As part of the implantation process the buried oxide layer 3 was destroyed in the region of source 5 and drain 6. The dosage of implanted ions was such as to ensure that the conductivity type in the regions where they were implanted ended up as N+. Following the ion implantation the structure was annealed so as to activate the implanted ions.

Figure 4:
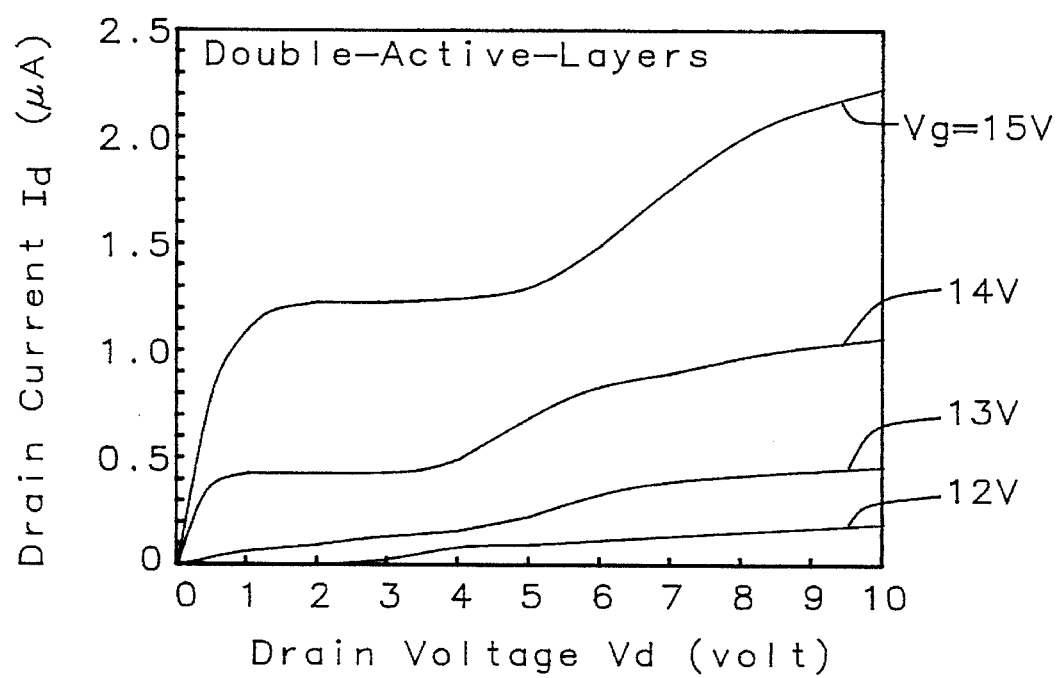
FIG. 4 is a current-voltage curve, for several gate voltages, before treatment in a hydrogen-nitrogen glow discharge.

At this stage, the future performance of the device is optimized by exposing it to a glow discharge in a mixture of hydrogen and nitrogen for a period of between 5 and 180 mins. This step, which has the effect of neutralizing many of holes and electrons trapped at the several silicon-silicon oxide interfaces, strongly influences the performance characteristics of the device as illustrated in the following examples: In FIG. 4 we show current vs. voltage curves for the drain region (for a series of gate voltages) obtained from a device that was not subjected to the hydrogen-nitrogen glow discharge treatment, while in FIG. 5 we show curves that were obtained in the same manner on a device that had received the hydrogen-nitrogen glow discharge treatment.

Figure 5:
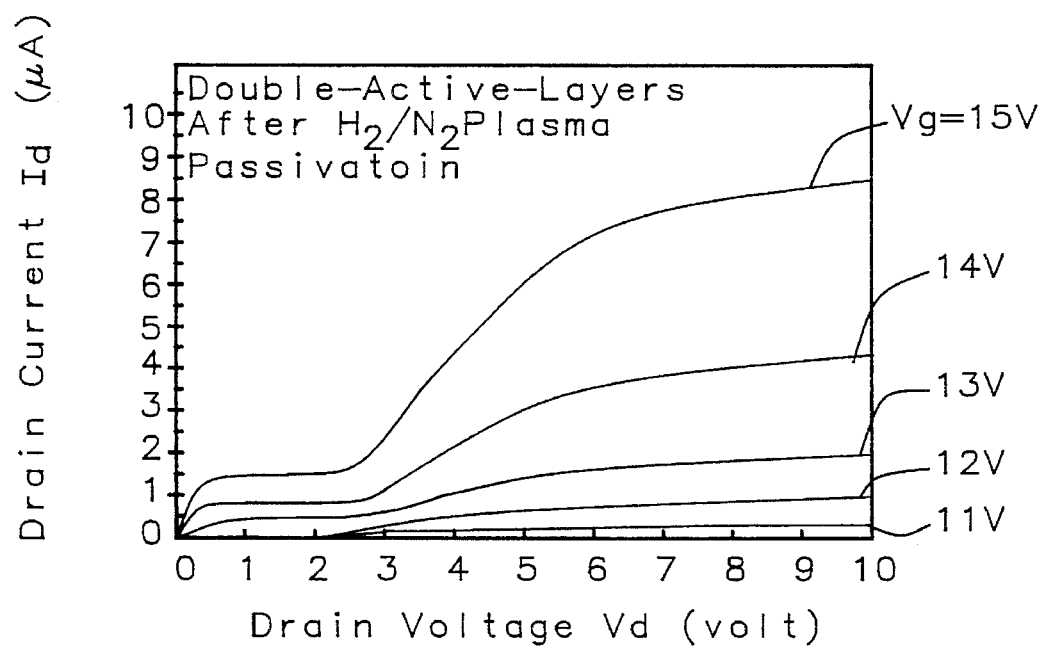
FIG. 5 is a current-voltage curve, for several gate voltages, after treatment in a hydrogen-nitrogen glow discharge.

The data contained in FIGS. 4 and 5 are summarized in TABLE I

TABLE I drain resistances for various drain voltages (gate voltage of 15 volts)

| DRAIN VOLTAGE | DRAIN RESISTANCE (Megohms) | |
| --- | --- | --- |
| volts | before glow discharge | after glow discharge |
| 1–2 | 10 | 10 |
| 3–5 | 7.5 | 0.6 |
| 5–9 | 5.3 | 1.3 |

Returning once more to FIG. 1, to complete the manufacture of the device, a protective layer of silicon oxide 10 is deposited over the entire surface by means of plasma-enhanced CVD (PECVD). Via holes are then etched in layer 10, so as to be able to make contact with the source, drain, and gate regions, and at least one layer of metal, typically aluminum, is deposited in order to fill the vias and make the requisite electrical contacts. An example of the contact metal layer for the upper gate is designated as 12 in FIG. 1.

Figure 6:
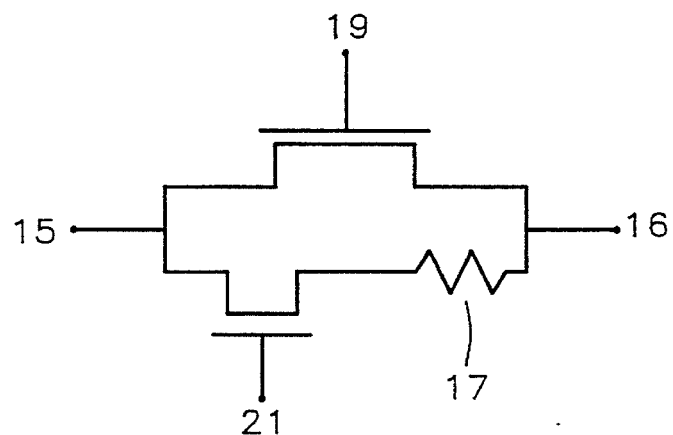
FIG. 6 shows the equivalent circuit of the device.

With a view to further enhancing understanding of the present invention, its equivalent circuit is shown in FIG. 6. As in a conventional FET, there is a source 15, a drain 16, and a gate 19. Under large drain bias, the weak avalanche breakdown at the top of active layer 8 (in FIG. 1) results in the accumulation of holes at its interface with buried oxide layer 3. The additional gate 21 (in FIG. 6) serves to enhance said hole accumulation which is controlled by both the gate bias as well as the drain bias. Note that resistor 17 (in FIG. 6) corresponds to the bottom active layer beyond the bias of gate 2 (in FIG. 1).

While the invention has been particularly shown and described with reference to the preferred embodiments thereof, it will be understood by those skilled in the art that various changes in form and details may be made without departing from the spirit and scope of the invention.

What is claimed is:

1. A double switching field effect transistor device comprising:

a semiconductor body of a given conductivity type;

source and drain regions imbedded within said semiconductor body and being of opposite conductivity type to said semiconductor body;

two active regions comprised of first and second layers of semiconducting material, of opposite conductivity type to said source and drain regions, that connect said source and drain regions to one another, said active regions being separated from each other by a first layer of insulating material;

second and third layers of insulating material lying on those surfaces of the two active regions that face away from said first layer of insulating material;

a third layer of semiconducting material lying on the surface of the layer of insulating material that is furthest from said semiconductor body;

a fourth layer of insulating material that covers and thereby passivates said source and drain regions as well as said third layer of semiconducting material; and via holes through said fourth layer of insulating material, said via holes being filled with conductive material for the purpose of making electrical contact to said source and drain regions as well as to said third layer of semiconducting material.

2. The double switching field effect transistor device as described in claim 1 wherein the thickness of said first layer of semiconducting material is between 50 and 3,000 Angstrom Units.

3. The double switching field effect transistor device as described in claim 1 wherein the thickness of said second layer of semiconducting material is between 50 and 3,000 Angstrom Units.

4. The double switching field effect transistor device as described in claim 1 wherein the thickness of said first layer of insulating material is between 500 and 1,000 Angstrom Units.

5. The double switching field effect transistor device as described in claim 1 wherein the thickness of said second layer of insulating material is between 20 and 1,000 Angstrom Units.

6. The double switching field effect transistor device as described in claim 1 wherein the thickness of said third layer of insulating material is between 20 and 1,000 Angstrom Units.

7. The double switching field effect transistor device as described in claim 1 wherein the thickness of said third layer of semiconducting material is between 500 and 10,000 Angstrom Units.

8. A process for the manufacture of a double switching field effect transistor device comprising:

providing a body of P type silicon;

creating a first layer of silicon oxide on one surface of said silicon body by heating in an oxidizing atmosphere;

depositing a first layer of polycrystalline silicon onto the surface of said first layer of silicon oxide;

creating a second layer of silicon oxide on the free surface of said first layer of polycrystalline silicon by heating in an oxidizing atmosphere;

depositing a second layer of polycrystalline silicon onto the surface of said second layer of silicon oxide;

masking and then etching down to the first layer of silicon oxide thereby defining a device region;

creating a third layer of silicon oxide on the free surface of said second layer of polycrystalline silicon by heating in an oxidizing atmosphere;

depositing a third layer of polycrystalline silicon onto the surface of said third layer of silicon oxide;

masking and then etching down to the level of said second layer of polycrystalline silicon so that the remaining third layers of polycrystalline silicon and silicon oxide are confined to a small area so as to constitute a gate electrode;

performing a self-aligned ion implementation using N type dopant ions to a dose level sufficient to ensure that said gate electrode is strongly N type and that N+ source and drain regions are created within the silicon body in areas immediately adjacent to said gate electrode, said ions being of such energy as to penetrate the silicon to a depth equal to that of said first layer of polycrystalline silicon;

exposing the device to a glow discharge in a mixture of hydrogen and nitrogen;

coating the gate electrode, source, and drain regions with a layer of passivating material and etching via holes through said passivating layer; and depositing at least one metallic layer for the purpose of making electrical contact to said gate electrode and the source and drain regions.

9. The process of claim 8 wherein the thickness of said first layer of silicon oxide is between 500 and 10,000 Angstrom Units.

10. The process of claim 8 wherein the thickness of said first layer of P type polycrystalline silicon is between 50 and 3,000 Angstrom Units.

11. The process of claim 8 wherein the final thickness of said second layer of silicon oxide is between 20 and 1,000 Angstrom Units.

12. The process of claim 8 wherein the thickness of said second layer of P type polycrystalline silicon is between 50 and 3,000 Angstrom Units.

13. The process of claim 8 wherein the final thickness of said third layer of silicon oxide is between 20 and 1,000 Angstrom Units.

14. The process of claim 8 wherein the thickness of said third layer of polycrystalline silicon is between 500 and 10,000 Angstrom Units.

15. The process of claim 8 wherein the energies of said ions of N type dopant material are between 20 and 200 keV.

16. The process of claim 8 wherein the time for which the device is exposed to a glow discharge in a mixture of hydrogen and nitrogen is between 5 and 180 minutes.

17. The process of claim 8 wherein said layer of passivating material is composed of silicon oxide that has been deposited through plasma enhanced chemical vapor deposition.

* * * * *